(12) United States Patent
Kimoto

(10) Patent No.: US 6,770,973 B2
(45) Date of Patent: Aug. 3, 2004

(54) SEMICONDUCTOR APPARATUS INCLUDING A MULTI-LAYER WIRING CONFIGURATION AND MANUFACTURING METHOD THEREFOR

(75) Inventor: Hisamitsu Kimoto, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/850,254

(22) Filed: May 7, 2001

(65) Prior Publication Data

US 2001/0050381 A1 Dec. 13, 2001

(30) Foreign Application Priority Data

May 8, 2000 (JP) .......................................... 2000/134761

(51) Int. Cl.[7] ................................................ H01L 23/48
(52) U.S. Cl. ...................................... 257/758; 257/750
(58) Field of Search ............................. 257/211, 750, 257/774, 775, 772, 773, 776, 758, 759, 760, 761, 762, 763, 744, 765, 766–770, 771

(56) References Cited

U.S. PATENT DOCUMENTS

| | | | | |
|---|---|---|---|---|
| 5,300,798 A | * | 4/1994 | Yamazaki et al. | |
| 5,329,139 A | * | 7/1994 | Sanada | |
| 5,656,833 A | * | 8/1997 | Kajihara | |
| 5,733,816 A | * | 3/1998 | Iyer et al. | |
| 6,064,097 A | * | 5/2000 | Hiraga | |

* cited by examiner

Primary Examiner—Nathan J. Flynn
Assistant Examiner—Kevin Quinto
(74) Attorney, Agent, or Firm—Darryl G. Walker; Bradley T. Sako

(57) ABSTRACT

A semiconductor apparatus and method for making the semiconductor apparatus are provided. The semiconductor memory device can include functional circuit blocks (100) having a multi-layer wiring structure for providing electrical connections between device elements within functional circuit blocks (100). Multi-layer wiring structure can include a wiring layer (M2) disposed in a M2 wiring layer horizontal track (120) and a M2 wiring layer vertical track (122). M2 wiring layer horizontal track (120) provides electrical connections by using wiring layer (M2) disposed in a horizontal direction and M2 wiring layer vertical track (122) provides electrical connections by using wiring layer (M2) disposed in a vertical direction. A wiring layer (M1) can form electrodes having electrical connections to diffusion regions of the device elements in functional circuit blocks (100). Wiring layer (M1) can have a higher sheet resistance and higher melting point than wiring layer (M2).

7 Claims, 7 Drawing Sheets

SEMICONDUCTOR APPARATUS INCLUDING A MULTI-LAYER WIRING CONFIGURATION AND MANUFACTURING METHOD THEREFOR

TECHNICAL FIELD

The present invention relates generally to internal wiring of a semiconductor apparatus and more particularly to a semiconductor apparatus fabricated using a multilayer wiring configuration.

BACKGROUND OF THE INVENTION

Recent efforts have been made in the semiconductor industry to develop improved micro-circuitry in order to enhance capabilities of semiconductor apparatuses. In highly integrated semiconductor apparatuses, the percentage of chip area used for wiring circuitry or interconnect has been increasing. Such wiring trends have been noticeable in various types of devices such as semiconductor memory devices and gate arrays.

As the technology for fabricating micro-circuit device elements in a semiconductor apparatus advances, the operating speed of the gating circuitry increases due to the decreased on-resistance of transistors such as metal-oxide semiconductor field effect transistors (MOSFETs). However, the width of the wiring lines used as an interconnect for the switching circuitry also becomes finer. The finer wiring requires smaller minimum dimensions such as width and/or thickness in the wiring layer. Due to the finer wiring, the resistance per unit length of the wiring circuit can increase. Also, due to the finer micro-circuit device elements, there can be an increased number of gating circuits on a chip and thus, it can be difficult to shorten the lengths of wiring circuitry due to the complexity of the layout. These factors can cause an increase in the RC (resistance-capacitance) time constant and adversely affect the overall operating speeds of the semiconductor apparatus.

In such densely integrated semiconductor apparatuses, decreasing the chip area by reducing wiring spacing is limited. Therefore, multi-layer wiring schemes have been used in which wiring layers are vertically separated by intervening insulation layers. The effectiveness of micro-fabrication of device elements can be improved by incorporating a multi-layer wiring process to provide multiple wiring layers.

In the process of manufacturing a semiconductor apparatus incorporating a multi-layer wiring scheme, a wiring layer having a high sheet resistance ($\Omega/\square$) may sometimes be used. For example, a first wiring layer can be a wiring layer that makes contact to and provides wiring for device diffusion layers. A high melting point metal (TiN/Ti, TiN, TiW, W, or the like) that has a high sheet resistance can be used as a material for the first wiring layer. In this example, Ti represents titanium, TiN represents titanium nitride, TiW represents titanium tungsten, and W represents tungsten.

One of the reasons for using a high melting point metal in the first wiring layer is related to the process of making memory cells, as just one example. In the case of a semiconductor memory such as a dynamic random access memory (DRAM) incorporating a capacitor over bit line (COB) memory cell, after fabricating the first wiring layer (which can be used for the bit lines), a high temperature treatment can be carried out to form a capacitor for storing charge in each memory cell. Thus, a high melting point metal is used as a material for the first wiring layer, due to its ability to withstand such a heat history. There are methods for forming the first wiring layer after making the capacitor of the memory cells, however, these methods can present a problem by increasing the capacitance of bit lines and/or reducing cell capacitance. Thus, the aforementioned method is used more frequently.

Referring now to FIG. 7, a conventional memory array is set forth in a block schematic diagram and given the general reference character 700. Conventional memory array includes capacitor over bit line (COB) memory cells MC connected by a bit line BL.

For example, if the first wiring layer of a three wiring layer configuration is used as an interconnect for a peripheral circuit of a semiconductor apparatus whose memory cell array has been fabricated by the above process, the resulting device can suffer from inferior properties including a slower operational speed due to the high resistance of the interconnect wiring.

For the reasons stated above, multi-layered wiring structures have been implemented in which, within functional blocks having device elements, a second wiring layer is used for an interconnect in a vertical direction and a third wiring layer is used for an interconnect in a horizontal direction. Such a configuration will now be discussed with reference to FIG. 5.

Referring now to FIG. 5, a top view of a schematic diagram of a conventional functional circuit block in a conventional semiconductor apparatus is set forth and given the general reference character 500. The conventional functional circuit 500 includes a plurality of MOSFETs having gate electrodes 501 and diffusion layers 502 for forming source and drain regions. Conventional functional circuit block 500 also includes, first wiring layer M1 (not shown), second wiring layer M2 and third wiring layer M3.

The material for the first wiring layer M1 is a high melting point metal and the material for the second and third layers is aluminum. Aluminum exhibits approximately a difference of two orders of magnitude lower sheet resistance than the high melting point metal.

However, in a semiconductor apparatus having conventional functional circuit blocks 500 arranged in a lattice or matrix configuration, it is not possible to use the second wiring layer M2 in the horizontal direction. Therefore, it is necessary to use the third wiring layer M3 for connecting to other function circuit blocks in the horizontal direction. In this case, the third wiring layer M3 is also used for internal wiring in a central region 510, and therefore, it is not possible to form wiring for mutual connections of blocks in the central region 510. For these reasons, a wiring region or wire routing channel disposed in the vertical direction between rows of blocks and having intra-block signal wiring running horizontally must be created to allow connections between functional circuit blocks using the third wiring layer M3.

Thus, an extra wiring region is required for the conventional semiconductor apparatus according to FIG. 5. This extra wiring region can increase the chip size by requiring routing regions over areas in which no device elements such as MOSFETs exist. This increase in chip size reduces the number of chips manufactured per wafer, thus increases production costs.

To prevent an increase in chip size, the first wiring layer M1 can be used for wiring in the vertical direction for short distances and the second wiring layer M2 can be used for connecting elements when longer wiring lengths are needed. Such a configuration will now be discussed with reference to FIG. 6.

Referring now to FIG. 6, a top view of a schematic diagram of a conventional functional circuit block in a conventional semiconductor apparatus is set forth and given the general reference character 600. The conventional semiconductor apparatus includes a plurality of MOSFETs having gate electrodes 601 and diffusion layers 602 for forming source and drain regions. Conventional functional circuit block 600 also includes, first wiring layer M1, second wiring layer M2 and third wiring layer M3.

It is noted that in FIG. 6, first wiring layer M1 is used for interconnect in the vertical direction within a conventional functional circuit block 600. The second wiring layer M2 is used for interconnect within the horizontal direction within the conventional function circuit block 600. This allows a central region 610 to be used for block to block interconnections without the addition of a separate routing channel outside the parameters of the conventional function circuit block 600.

However, when high resistive wiring, such as first wiring layer M1, is used for interconnections between device elements even for a short wiring distance can adversely affect the performance (operating speed and other parameters) of the functional block. This is particularly true as device element geometries are reduced allowing circuitry to operate at higher frequencies.

In view of the above discussion, it would be desirable to provide a semiconductor apparatus and a manufacturing method for the semiconductor apparatus to form wiring within each functional circuit block without affecting the performance of the apparatus.

SUMMARY OF THE INVENTION

According to the present embodiments, a semiconductor apparatus incorporating a multi-layer wiring structure can include a functional circuit block having device elements that can be electrically connected with a wiring layer formed within a wiring region for wirings disposed in a first direction and a wiring region for wirings disposed in a second direction.

According to one aspect of the embodiments, the first direction can be orthogonal to the second direction.

According to another aspect of the embodiments, each device element can include a diffusion region. A wiring layer can produce electrodes electrically connected to diffusion regions of device elements.

According to another aspect of the embodiments, a first wiring layer providing electrodes to diffusion regions can be disposed in a first direction in parallel with and electrically connected to a second wiring layer disposed in a first direction in a wiring region.

According to another aspect of the embodiments, the wiring layer providing electrodes to diffusion regions can have a higher resistance than the wiring layer disposed in a first direction in a wiring region and in a second direction in another wiring region.

According to another aspect of the embodiments, the wiring layer providing electrodes to diffusion regions can have a higher melting point than the wiring layer disposed in a first direction in a wiring region and in a second direction in another wiring region.

According to another aspect of the embodiments, the circuit blocks can be arranged in a first direction and/or a second direction on the surface of a semiconductor substrate.

According to another aspect of the embodiments, the wiring layer providing electrodes to diffusion regions can be used to provide bit lines in a memory array.

According to another aspect of the embodiments, the memory array can include DRAM cells having a capacitor over bit line structure.

According to another aspect of the embodiments a method may include forming a semiconductor apparatus by electrically connecting functional blocks with a multi-layer wiring configuration in which each functional block includes a first wiring region having a wiring layer disposed in a first direction and a second wiring region having the wiring layer disposed in a second direction.

According to another aspect of the embodiments, the method for forming a semiconductor apparatus includes forming a diffusion layer associated with device elements on the surface of a substrate.

According to another aspect of the embodiments, the method for forming a semiconductor apparatus includes forming a first interlayer film providing an insulator between a first wiring layer and the substrate.

According to another aspect of the embodiments, the method for forming a semiconductor apparatus includes forming a first wiring layer to produce electrodes electrically connected to diffusion layers of device elements.

According to another aspect of the embodiments, the method for forming a semiconductor apparatus includes forming a second insulation film providing an insulator between the first wiring layer and a second wiring layer.

According to another aspect of the embodiments, the method for forming a semiconductor apparatus includes forming a second wiring layer wherein for each functional block a first wiring region provides electrical connections using the second wiring layer in a first direction only and a second wiring region provides electrical connections using the second wiring layer in a second direction only.

According to another aspect of the embodiments, the method for forming a semiconductor apparatus includes the first wiring layer having a higher sheet resistance and melting point than the second wiring layer.

According to another aspect of the embodiments, the method for forming a semiconductor apparatus includes forming bit lines for a memory array when forming the first wiring layer.

DETAILED DESCRIPTION OF THE EMBODIMENTS

Various embodiments of the present invention will now be described in detail with reference to a number of drawings.

Figure 1:
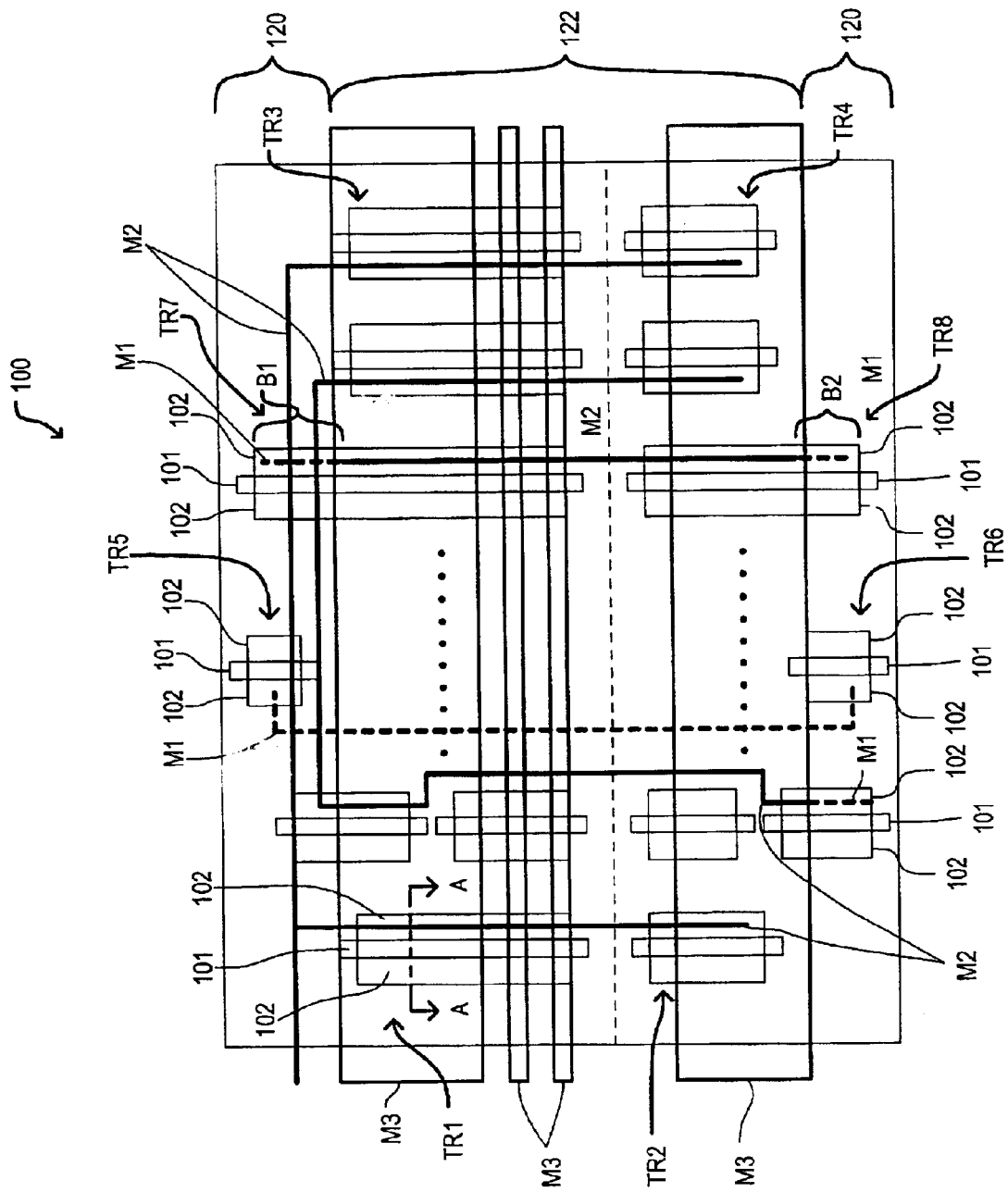
FIG. 1 is a top view of a schematic diagram of a functional circuit block in a semiconductor apparatus according to one embodiment.

Referring now to FIG. 1, a top view of a schematic diagram of a functional circuit block in a semiconductor apparatus according to one embodiment is set forth and given the general reference character 100. Functional circuit 100 can include a plurality of device elements. As just one example, device elements can include MOSFETs having gate electrodes 101 and diffusion layers 102 for forming source and drain regions. Functional circuit block 100 can also include, first wiring layer M1, second wiring layer M2 and third wiring layer M3.

The material for the first wiring layer M1 can be a high melting point metal (TiN/Ti, TiN, TiW, W, or the like) that has a relatively high sheet resistance as compared to second and third wiring layers (M2 and M3).

As but one example, the material for the second and third wiring layers (M2 and M3) can be aluminum. Aluminum can exhibit approximately a difference of two orders of magnitude lower sheet resistance than the high melting point metal. Although specific values can depend on film thickness, values of the sheet resistance of aluminum can be several tens of m$\Omega$/□ and values of the sheet resistance of a high melting point metal can be several $\Omega$/□.

In the embodiment of FIG. 1, in each functional circuit block 100 a wiring region for wiring layer M2 can include an M2 horizontal track wiring region 120 and a M2 vertical track wiring region 122. In the M2 horizontal track wiring region 120, wiring layer M2 can be used for forming electrical connections in the horizontal direction. In the M2 vertical track wiring region 122, wiring layer M2 can be used for forming electrical connections in the vertical direction.

M2 horizontal track wiring region 120 may not include wiring layer M2 forming electrical connections in the vertical direction as this may reduce the efficiency of M2 horizontal track wiring region 120. Likewise, M2 vertical track wiring region 122 may not include wiring layer M2 forming electrical connections in the horizontal direction as this may reduce the efficiency of M2 vertical track wiring region 122.

For example, a first buffer can be formed including transistors (TR1 and TR2). Transistor TR1 can be a p-channel MOSFET and transistor TR2 can be an n-channel MOSFET. Transistors (TR1 and TR2) can be driver transistors having relatively high current sourcing and/or sinking capabilities. A drain terminal of transistor TR1 can be electrically connected to a drain terminal of transistor TR2 with wiring layer M2 which can be routed in the vertical direction in the M2 vertical wiring region 122. Drain terminals of transistors (TR1 and TR2) can be respective regions of diffusion layer 102.

Wiring layer M2 used for electrically connecting drain terminal of transistor TR1 to a drain terminal of transistor TR2 can be electrically connected and parallel with wiring layer M1 which can also be routed in the vertical direction. Wiring layer M2 can be electrically connected with wiring layer M1 by way of via holes V over a wide area in specific locations (shown in FIG. 2). This will be explained in further detail later.

In this manner, a buffer can be formed using wiring layer M2 having a low sheet resistance and can allow increased operational speeds of functional circuit block 100. Improved current flow may be achieved in order that operational requirements may be met while achieving smaller chip area than in the conventional approach.

A second buffer can be formed including transistors (TR3 and TR4). Transistor TR3 can be a p-channel MOSFET and transistor TR4 can be an n-channel MOSFET. Transistors (TR3 and TR4) can be driver transistors having relatively high current sourcing and/or sinking capabilities. A drain terminal of transistor TR3 can be electrically connected to a drain terminal of transistor TR4 with wiring layer M2 which can be routed in the vertical direction in the M2 vertical wiring region 122. Drain terminals of transistors (TR3 and TR4) can be respective regions of diffusion layer 102.

First buffer (TR1 and TR2) and second buffer (TR3 and TR4) can be electrically connected in parallel to form a buffer that can have an even larger current drive capability. This can be accomplished by electrically connecting first and second buffers (TR1 and TR2) and (TR3 and TR4) by way of a horizontal wiring pattern formed in the M2 horizontal wiring region 120 in wiring layer M2.

An inverter can be formed including transistors (TR5 and TR6). Transistor TR5 can be a p-channel MOSFET and transistor TR6 can be an n-channel MOSFET. Transistors (TR5 and TR6) can have relatively low current sourcing and/or sinking capabilities. A drain terminal of transistor TR5 can be electrically connected to a drain terminal of transistor TR6 with wiring layer M1 which can be routed in the vertical direction. Drain terminals of transistors (TR5 and TR6) can be respective regions of diffusion layer 102. In this manner, wiring layer M1 can be used to electrically connect device elements in circuitry that may only require relatively low current flows when operating. Therefore, operating speeds of functional circuit block 100 may not be adversely affected.

In some cases, a buffer having a relatively high current sinking and/or sourcing requirement may include circuit elements that may cross M2 horizontal track wiring region 120. Such an example can include a buffer formed including transistors (TR7 and TR8). Transistor TR7 can be a p-channel MOSFET and transistor TR8 can be an n-channel MOSFET. Transistors (TR7 and TR8) can be driver transistors having relatively high current sourcing and/or sinking capabilities. A drain terminal of transistor TR7 can be electrically connected to a drain terminal of transistor TR8 substantially with wiring layer M2 which can be routed in the vertical direction in the M2 vertical track wiring region 122. Drain terminals of transistors (TR7 and TR8) can be respective regions of diffusion layer 102.

However, in order to prevent creating an electrical short with wiring layer M2 in M2 horizontal track wiring region 120, crossing sections (B1 and B2) can use wiring layer M1 for the electrical connection. It is noted that portions of wirings electrically connecting respective diffusion layer regions 102 of transistors (TR7 and TR8) can be connected by a vertical wiring pattern in wiring layer M2, so that there may be no danger that low current flow caused by a relatively high sheet resistance can limit the performance of functional circuit block 100.

Figure 3:
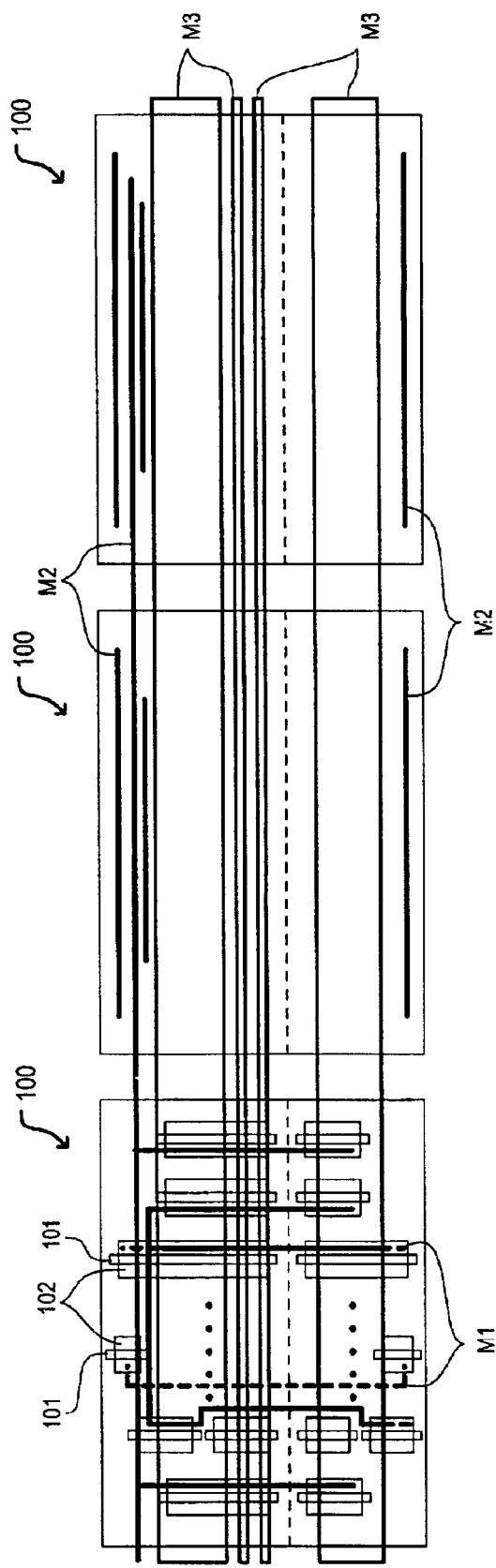
FIG. 3 is a top view of a schematic diagram of a plurality of functional circuit blocks arranged horizontally according to one embodiment.

Referring now to FIG. 3, a top view of a schematic diagram of a plurality of functional circuit blocks 100 arranged horizontally according to one embodiment is set forth. By using wiring layer M1 effectively, wiring layer M2 may be used for successively connecting lateral signal terminals that may be located inside a plurality of functional circuit blocks 100 arranged horizontally. FIG. 3 illustrates the relationship of adjacent functional circuit blocks 100 and wiring layers M2 and M3.

As can be seen in FIG. 3, wiring layer M2 may be used (as opposed to wiring layer M3) for electrically connecting signal terminals of horizontally arranged functional circuit blocks 100. This may eliminate the necessity for creating a M3 wiring region horizontal track or wire routing channel outside of functional circuit blocks 100 for interconnects between functional circuit blocks 100. This can reduce the chip size of the semiconductor apparatus by an amount equal to the size of a M3 wiring region horizontal track or wire routing channel, which may no longer be necessary.

By following such a wiring scheme, relatively large current carrying wiring for first and second buffers can be provided by wiring layer M2 so that buffers can be produced that may satisfy a required current drive capability without being restricted by the relatively high resistance of wiring layer M1.

Figure 2:
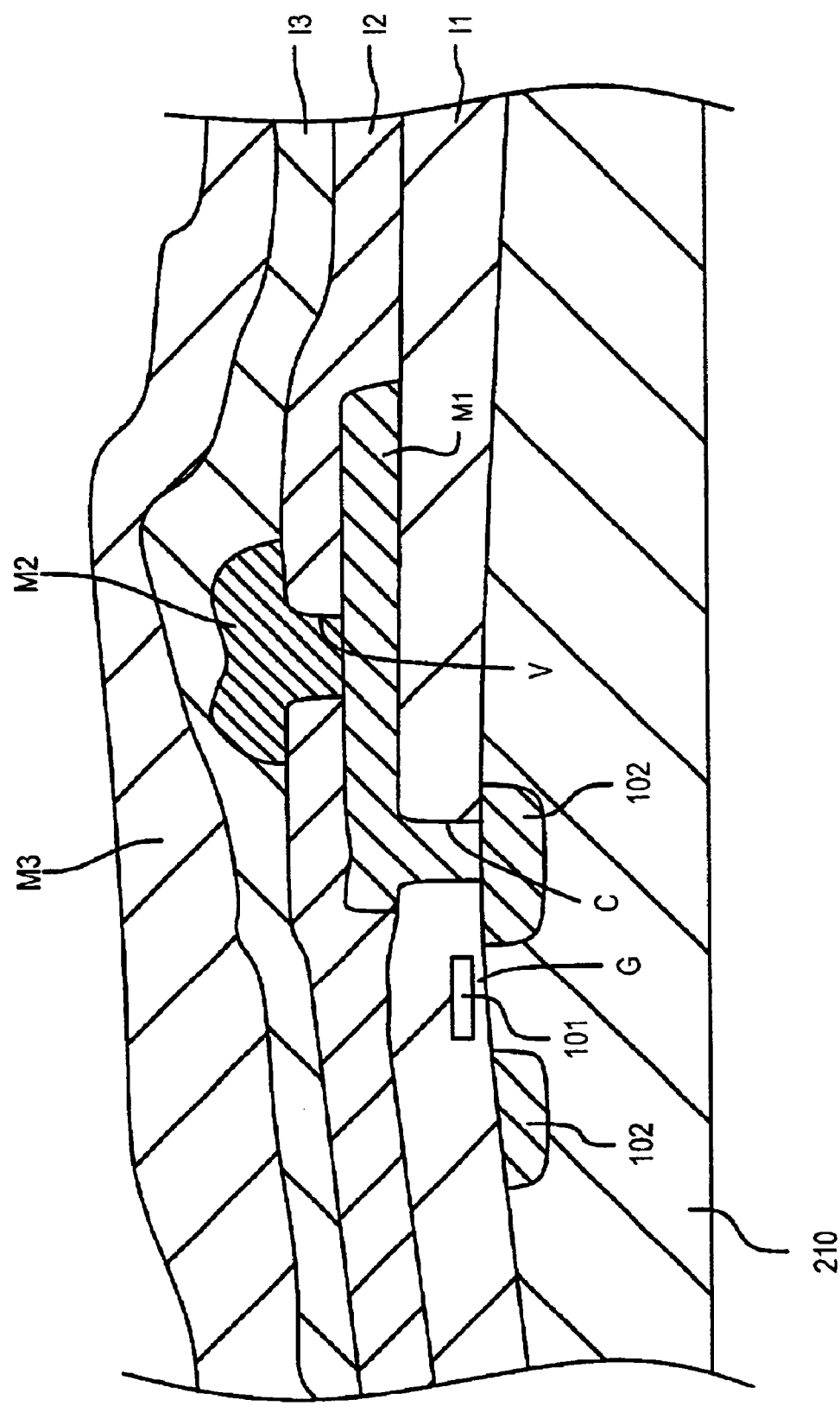
FIG. 2 is a cross-sectional view through line A—A in the embodiment of FIG. 1.

Referring now to FIG. 2, a cross-sectional view through line A—A in the embodiment of FIG. 1 is set forth. It can be seen in FIG. 2, that diffusion layer 102 and wiring layer M2 can be electrically connected by way of wiring layer M1 through via V and contact C. This structure will be described in detail later in a method of manufacturing the semiconductor apparatus.

Referring once again to FIG. 1, as described above in the region of M2 wiring layer horizontal track 120, wiring layer M2 may be used for wiring in the horizontal direction and in the region of M2 wiring layer vertical track 122, wiring layer M2 may be used for wiring in the vertical direction.

On the other hand, wiring layer M3, may not be used as a low resistance path for locally interconnecting device elements, such as MOSFETs within functional circuit block 100. Instead, wiring layer M3 may be used for electrically connecting selected common signal terminals (such as VDD, VSS, control signals, just to name a few examples) in each functional block 100 in the horizontal direction.

For this reason, wiring layer M3 may be formed in any region of functional block 100, which may allow a decrease in the width of wiring regions that may be needed for connecting functional blocks 100 as compared to conventional approaches. Accordingly, in the present invention, the chip size of the semiconductor apparatus may be made smaller compared with conventional examples. This may allow an increased number of chips to be manufactured on a wafer, thus improving the manufacturing productivity and reducing the cost of production per chip of the semiconductor apparatus.

Furthermore, required operational properties may be more readily obtained because signals requiring relatively high current flow within each functional block 100 may be routed using a wiring layer with a lower relative resistance than wiring layer M1.

Next, positional relationships of wiring layer (M1, M2, and M3) and a manufacturing process of the semiconductor apparatus will be explained with reference to FIG. 2.

Referring once again to FIG. 2, a cross-sectional view through line A—A in the embodiment of FIG. 1 is set forth. Semiconductor apparatus may include a substrate 210. Source and drain regions may be patterned by using a local oxidation of silicon (LOCOS) process and diffusion layer 102 may be formed by successive steps of ion injection and heat treatment. Diffusion layer 102 may form source and/or drain regions of a MOSFET.

A gate oxidation film G may then be formed on the surface of substrate 210 by using a process such as a thermal oxidation process or chemical vapor deposition (CVD) process.

A material for forming gate electrodes 101 may then be deposited on the surface of gate oxidation film G using a CVD method. A pattern and etch process may then be used to form gate electrodes 101.

An interlayer insulation film I1 may then be formed so that gate electrodes 101 and diffusion layer 102 may not short circuit with wiring layer M1 which may be subsequently formed.

Contact holes C may then be formed by a patterning process. Contact holes C may expose the surface of diffusion layer 102 which can allow wiring layer M1 to make an electrical connection to diffusion layer 102 in selected locations.

A material for wiring layer M1 may then be deposited by a CVD or sputtering method and then may be patterned to form a predetermined wiring pattern. Diffusion layer 102 and wiring layer M1 may be electrically connected at the locations of contact holes C. Diffusion layer 102 may be insulated from wiring layer M1 by interlayer insulation film I1 in predetermined sections in which no electrical connection may be desired and may be electrically connected to wiring layer M1 through contact holes C through interlayer insulation film I1 at desired locations.

An interlayer insulation film I2 may then be deposited on the exposed surfaces of wiring layer M1 and interlayer insulation film I1 by a CVD method. Interlayer insulation film I2 may be formed so that wiring layer M1 and wiring layer M2 that will be subsequently formed can be electrically isolated when desired.

Via holes V may then be formed by a patterning process. Via holes V may expose the surface of wiring layer M1, which can allow wiring layer M2 to make an electrical connection to wiring layer M1 in selected locations.

A material for wiring layer M2 may then be deposited by a CVD or sputtering method and then may be patterned to form a predetermined wiring pattern. In this case, wiring patterns on wiring layer M2 may be formed in such a way that, in the M2 wiring layer horizontal track, wiring layer M2 may be formed in the horizontal direction (as seen in FIG. 1) and in the M2 wiring layer vertical track, wiring layer M2 may be formed in the vertical direction (as seen in FIG. 1).

Wiring layer M1 and wiring layer M2 may be electrically connected at the locations of via holes V. Wiring layer M1 may be insulated from wiring layer M2 by interlayer insulation film I2 in predetermined sections in which no electrical connection may be desired and may be electrically connected to wiring layer M2 through via holes V through interlayer insulation film I2 at desired locations.

An interlayer insulation film I3 may then be deposited on the exposed surfaces of wiring layer M2 and interlayer insulation film I2 by a CVD method. Interlayer insulation film I3 may be formed so that wiring layer M2 and wiring layer M3 that will be subsequently formed can be electrically isolated when desired.

Via holes (not shown) may then be formed by a patterning process. Via holes may expose the surface of wiring layer M2, which can allow wiring layer M3 to make an electrical connection to wiring layer M2 in selected locations.

A material for wiring layer M3 may then be deposited by a CVD or sputtering method and then may be patterned to form a predetermined wiring pattern. Wiring layer M2 and wiring layer M3 may be electrically connected at the locations of via holes (not shown in FIG. 2). Wiring layer M2 may be insulated from wiring layer M3 by interlayer insulation film I3 in predetermined sections in which no electrical connection may be desired and may be electrically connected to wiring layer M3 through via holes (not shown) through interlayer insulation film I3 at desired locations.

Accordingly, when electrically connecting diffusion layer 102 or gate electrode 101 to wiring layer M2, an electrical connection may be made through wiring layer M1. It can also be seen, when electrically connecting diffusion layer 102 or gate electrode 101 to wiring layer M3, an electrical connection may be made through wiring layer M1 and wiring layer M2.

A high melting point metal (TiN/Ti, TiN, TiW, W, or the like), which has a relatively high sheet resistance, can be used for wiring layer M1. On the other hand, a metal (aluminum or the like) having relatively low sheet resistance may be used as the material for wiring layers M2 and M3.

In the processes described above, a heat treatment step at a temperature exceeding the melting point of aluminum may be executed in the interval between forming wiring layer M1 and wiring layer M2. The heat treatment step may be executed in process steps for fabricating storage capacitors or the like on a DRAM. Also, wiring layer M1 may be used as the wiring layer for forming bit lines in a DRAM. A DRAM incorporating the present invention may include a capacitor over bit line (COB) cell structure.

It is understood that the embodiments described above are exemplary and the present invention should not be limited to those embodiments. Specific structures should not be limited to the described embodiments.

Figure 4:
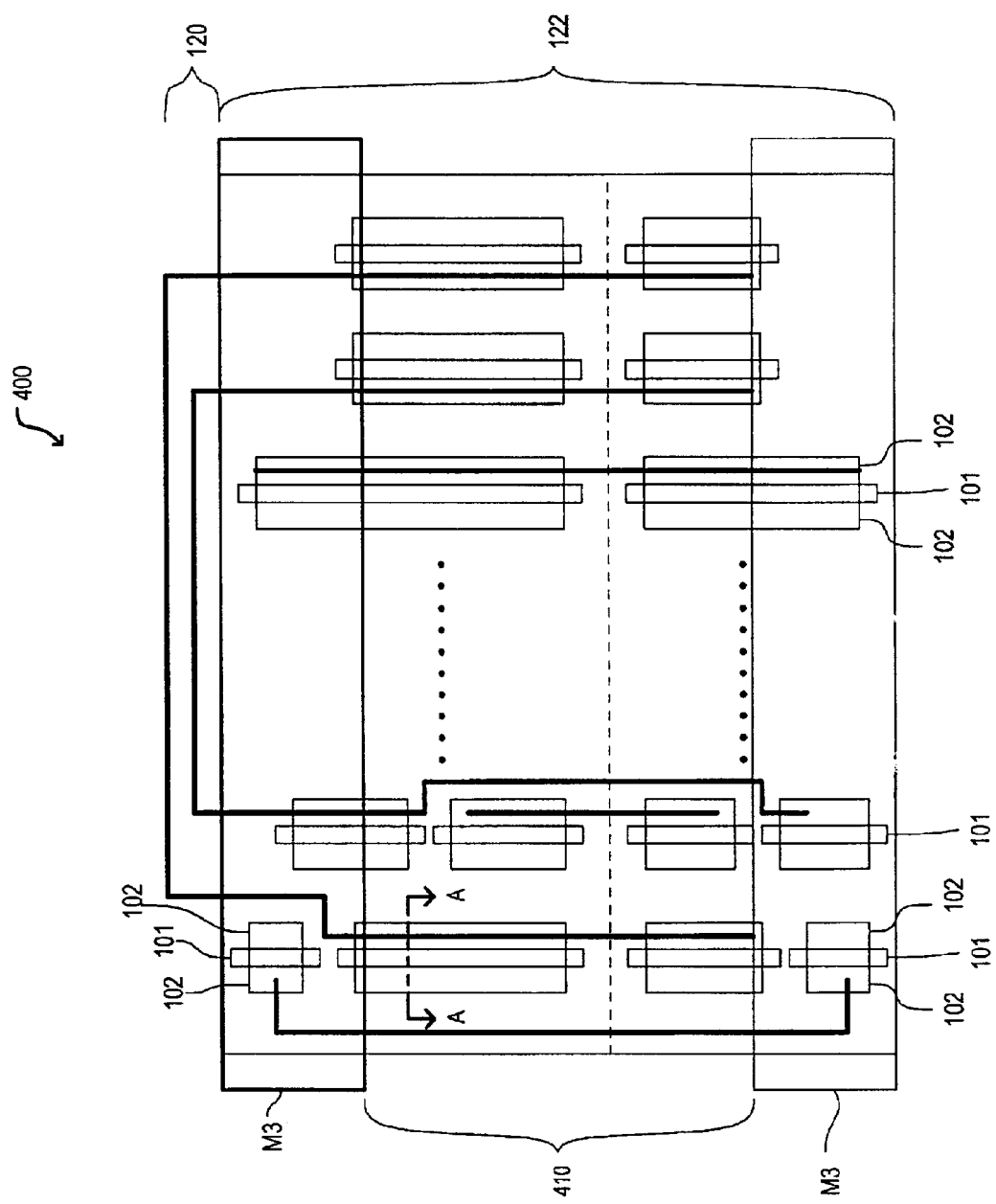
FIG. 4 is a top view of a schematic diagram of a functional circuit block in a semiconductor apparatus according to one embodiment.
Figure 5:
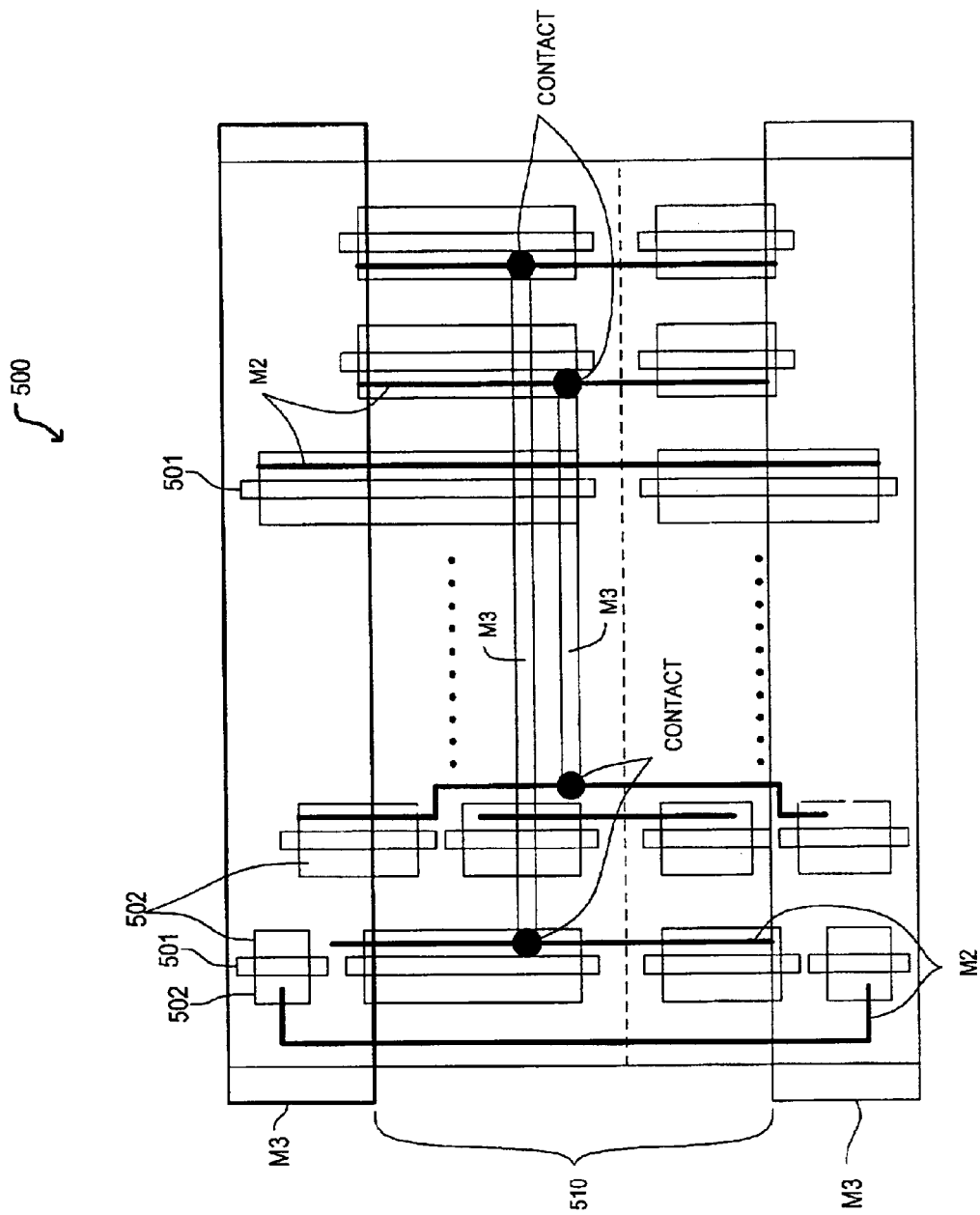
FIG. 5 is a top view of a schematic diagram of a conventional functional circuit block in a conventional semiconductor apparatus.
Figure 6:
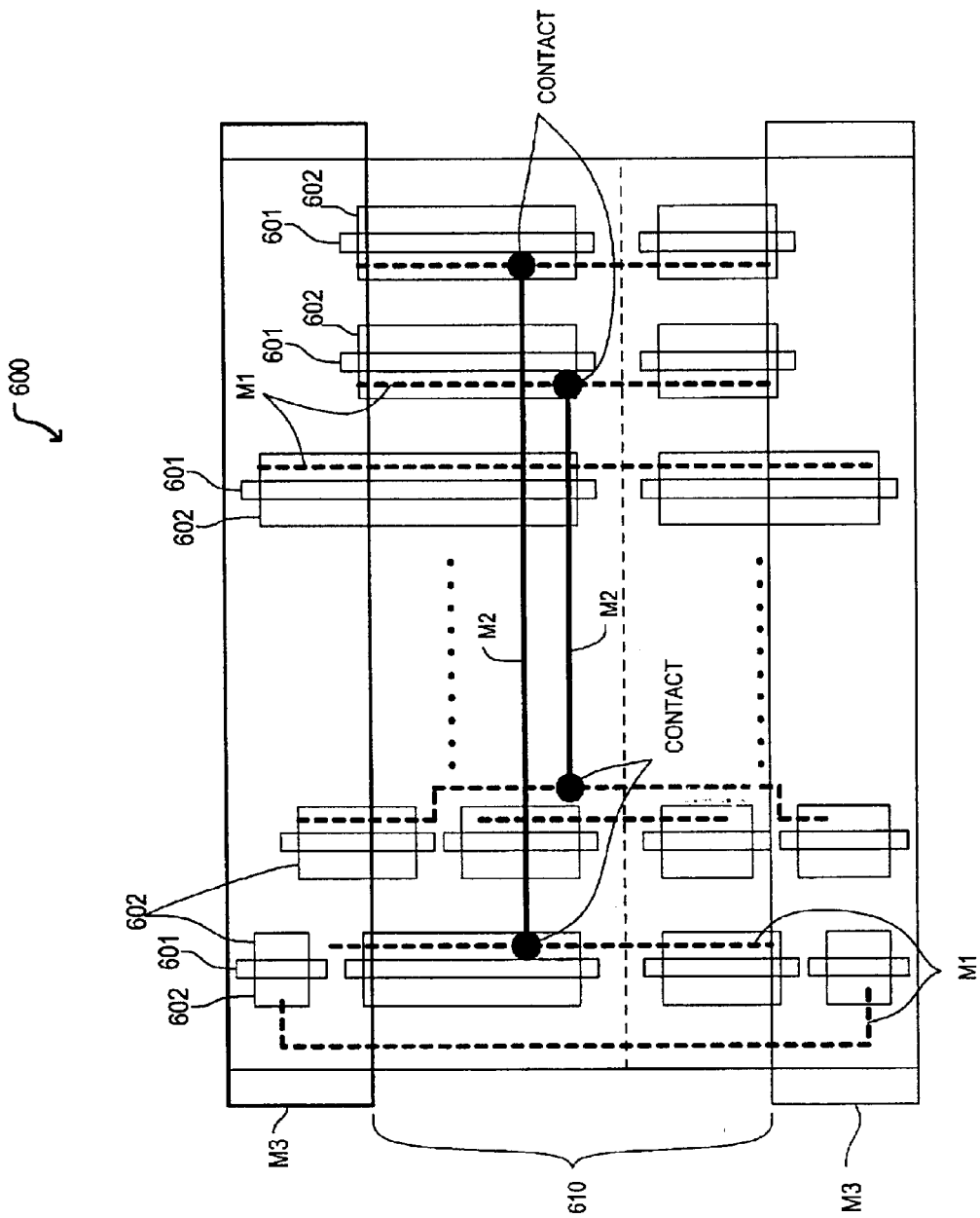
FIG. 6 is a top view of a schematic diagram of a conventional functional circuit block in a conventional semiconductor apparatus.
Figure 7:
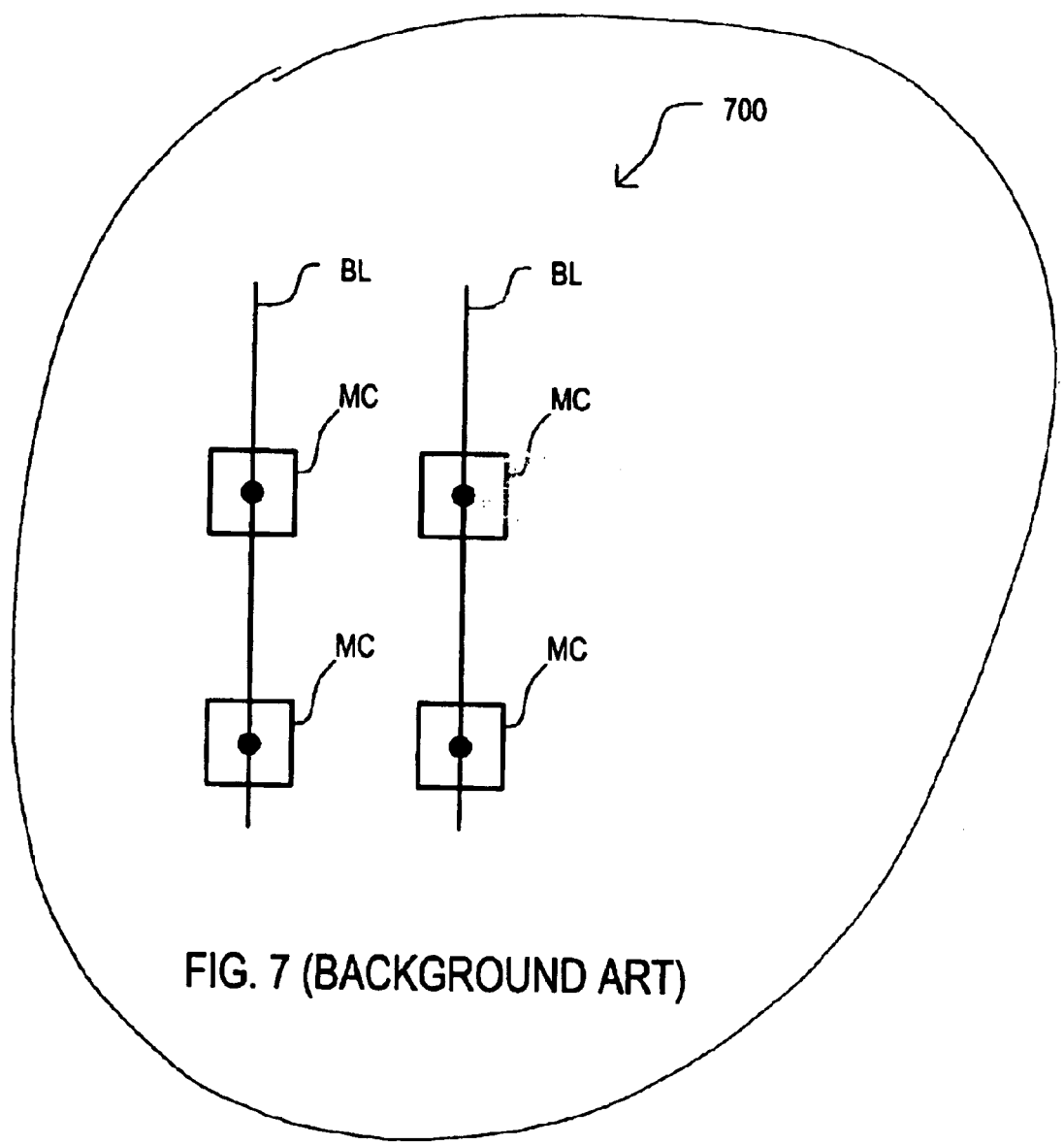
FIG. 7 is a block schematic diagram of a conventional memory array.

Referring now to FIG. 4, a top view of a schematic diagram of a functional circuit block in a semiconductor apparatus according to one embodiment is set forth and given the general reference character 400. Functional circuit block 400 can include constituents that are similar to constituents of functional circuit block 100 of FIG. 1. Thus, such constituents will be given the same reference character. Descriptions of such constituents may be omitted.

In functional circuit block 400, a wiring region for wiring layer M2 can include an M2 horizontal track wiring region 120 and a M2 vertical track wiring region 122. In the M2 horizontal track wiring region 120, wiring layer M2 can be used for forming electrical connections in the horizontal direction. In the M2 vertical track wiring region 122, wiring layer M2 can be used for forming electrical connections in the vertical direction.

The functional circuit block 400 of FIG. 4 may differ from the functional circuit block 100 of FIG. 1, in that M2 wiring layer horizontal track 120 may be extended beyond the device elements of functional circuit block 400.

It is also noted that cross sectional line view through the line A—A in functional circuit block 400 as in functional circuit block 100 and accordingly a cross-sectional view may be similar to FIG. 2. However it is noted that wiring layer M3 has been omitted in region 410 of functional circuit block 400.

When functional circuit blocks are arranged in a matrix configuration, if it is not possible to provide the necessary wirings in wiring layer M3 in region 410, it may be necessary to provide a region or routing channel for wiring layer M3 between vertically adjacent functional blocks. In such a case, this region or routing channel may be used effectively as M2 wiring layer horizontal track 120 in which wiring layer M2 may provide wiring patterns formed in the horizontal direction.

Accordingly, a semiconductor apparatus incorporating functional circuit block 400 may provide a beneficial layout that may provide wiring to each circuit element (such as transistors) in the functional circuit block by using wiring layer M2. Thus, a semiconductor apparatus incorporating functional circuit block 400 may improve operational properties of the semiconductor apparatus without increasing the chip size.

It is understood that the embodiments described above are exemplary and the present invention should not be limited to those embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor apparatus, comprising:
a plurality of device elements formed on a surface of a semiconductor substrate, each device element having a diffusion region;
a multi-layer wiring configuration electrically connecting at least two of the diffusion regions, the multi-layer wiring configuration containing a plurality of wiring layers, a first one of the plurality of wiring layers being divided into a first wiring region for providing wiring in a first direction and a second wiring region for providing wiring in a second direction; and
predetermined wiring in the first one of the plurality of wiring layers is electrically connected to and disposed in parallel with wiring in a second one of the plurality of wiring layers; wherein
the first direction is orthogonal to the second direction; and
the second one of the plurality of wiring layers has a higher sheet resistance than the first one of the plurality of wiring layers.

2. The semiconductor apparatus according to claim 1, wherein the first one of the plurality of wiring layers includes:
a first wiring trace in the second wiring region disposed in the second direction;
a second wiring trace in the second wiring region disposed in the second direction and separated from the first wiring trace in the first direction; and
a third wiring trace in the first wiring region disposed in the first direction and electrically connecting the first wiring trace and the second wiring trace.

3. The semiconductor apparatus according to claim 1, further including:
a memory array having bit lines formed with bit line wiring layers of the same material as the second one of the plurality of wiring layers.

4. The semiconductor apparatus according to claim 3, wherein the memory array has dynamic random access memory cells having a capacitor over bit line structure.

5. A semiconductor apparatus, comprising:
a plurality of functional circuit blocks disposed in a matrix on the surface of a semiconductor substrate, each functional circuit block including a plurality of device elements, a first wiring region and a second wiring region; and
a multi-layer wiring configuration containing a plurality of wiring layers for electrically connecting predetermined ones of the device elements, the multi-layer wiring configuration including a first one of the plurality of wiring layers disposed in the first wiring region providing first wiring in a first direction and the first one of the plurality of wiring layers disposed in the second wiring region providing second wiring in a second direction; wherein
the first direction is orthogonal to the second direction;
a predetermined first portion of the first one of the plurality of wiring layers is electrically connected to and disposed in parallel with wiring in a second one of the plurality of wiring layers; and the second one of the plurality of wiring layers has a higher sheet resistance than the first one of the plurality of wiring layers.

6. The semiconductor apparatus according to claim 5, wherein the second one of the plurality of wiring layers has a higher melting point than the first one of the plurality of wiring layers.

7. The semiconductor apparatus of claim 5, further including:
a memory array having bit lines formed with bit line wiring layers of the same material as the second one of the plurality of wiring layers.

* * * * *